(12) United States Patent
David et al.

(10) Patent No.: US 10,742,199 B2
(45) Date of Patent: Aug. 11, 2020

(54) STATE RETENTION CIRCUIT THAT RETAINS DATA STORAGE ELEMENT STATE DURING POWER REDUCTION MODE

(71) Applicant: SILICON LABORATORIES INC., Austin, TX (US)

(72) Inventors: Thomas S. David, Lakeway, TX (US); Wasim Quddus, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/416,462

(22) Filed: May 20, 2019

(65) Prior Publication Data

US 2019/0334507 A1 Oct. 31, 2019

Related U.S. Application Data

(62) Division of application No. 15/963,316, filed on Apr. 26, 2018, now Pat. No. 10,340,894.

(51) Int. Cl.
*H03K 17/24* (2006.01)
*H03K 3/012* (2006.01)
(Continued)

(52) U.S. Cl.
CPC ............. *H03K 3/012* (2013.01); *H03K 3/289* (2013.01); *H03K 3/3562* (2013.01);
(Continued)

(58) Field of Classification Search
CPC .... H03K 3/012; H03K 3/35625; H03K 17/24; H03K 17/22; H03K 17/223;
(Continued)

(56) References Cited

U.S. PATENT DOCUMENTS

| 7,791,389 B2* | 9/2010 | Remington ............ H03K 3/012 |
| | | 327/202 |
| 2018/0159513 A1 | 6/2018 | Reddy et al. |
| 2018/0181175 A1 | 6/2018 | Augustine et al. |

OTHER PUBLICATIONS

Shearer, Findlay, *Power Management in Mobile Devices*. Elsevier, Newnes, 2008, pp. 82-85.

* cited by examiner

*Primary Examiner* — Jung Kim
(74) *Attorney, Agent, or Firm* — Gary Stanford; Huffman Law Group, PC

(57) ABSTRACT

A semiconductor device that retains a state of a data storage element during a power reduction mode including supply rails and voltages, and a storage latch and a retention latch both powered by retention supply voltage that remains energized during a power reduction mode. The storage latch and the retention latch are both coupled to a retention node that is toggled between first and second states before entering the power reduction mode. The toggling causes the storage latch to latch the state of the data storage element during the normal mode, and the retention node enables the storage element to hold the state during the power reduction mode. The retention latch includes a retention transistor and a retention inverter powered by the retention supply voltage. The retention inverter keeps the retention transistor turned on and the retention transistor holds the state of the retention node during the power reduction mode.

10 Claims, 3 Drawing Sheets

(51) Int. Cl.
*H03K 3/3562* (2006.01)
*H03K 3/289* (2006.01)
*H03K 3/356* (2006.01)

(52) U.S. Cl.
CPC ... *H03K 3/35625* (2013.01); *H03K 3/356008* (2013.01); *H03K 17/24* (2013.01)

(58) Field of Classification Search
CPC .. H03K 3/0372; H03K 3/02332; H03K 3/287; H03K 3/288; H03K 3/289; H03K 3/356017; H03K 3/356026; H03K 3/356052; H03K 3/356069; H03K 3/3562; H03K 3/02335; H03K 3/0375; H03K 3/2865; H03K 3/356008
See application file for complete search history.

STATE RETENTION CIRCUIT THAT RETAINS DATA STORAGE ELEMENT STATE DURING POWER REDUCTION MODE

CROSS-REFERENCE TO RELATED APPLICATIONS

This application is a divisional application of copending, commonly assigned and currently pending U.S. patent application Ser. No. 15/963,316, filed on Apr. 26, 2018, which is herein incorporated by reference for all intents and purposes.

BACKGROUND OF THE INVENTION

Field of the Invention

The present invention relates in general to state retention, and more particularly to a state retention circuit that retains the state of a data storage element during a power reduction mode that allows reduction or elimination of always on buffers.

Description of the Related Art

Power consumption may be reduced by entering a power reduction mode during periods of inactivity, such as a low power mode or sleep mode or the like, in which a majority of the circuitry including synchronous digital logic may be powered down. In many situations, however, the state of the digital logic should be saved so that operation may be resumed without loss of information. In many configurations, storage latches (e.g., a bubble latches) may be used to save the state of multiple data storage elements, such as flip flops and the like, that collectively define the state of the circuitry during any power reduction mode. A retention signal routed to each storage latch is pulsed or toggled to save the state of a corresponding data storage element prior to entering the power reduction mode. Once saved, the primary supply voltage is de-energized to power down the circuitry including the data storage elements, while a retention supply voltage retains power to the storage latches during the power reduction mode. The primary supply voltage is re-energized to restore power, and a load signal or the like routed to each storage latch prompts restoring the states of the data storage elements to resume normal operation.

A large circuit may include tens of thousands or more of such state retention data storage elements, which are distributed across the semiconductor die of the integrated circuit (IC). The retention signal must be routed to each storage latch of each data storage element and must hold its state during the power reduction mode. In conventional configurations, an always on buffer (AOB) tree formed by branches of interconnected AOBs is distributed from a power mode control circuit across the IC to each storage latch, in which each AOB is powered by the retention supply voltage (hence always powered on). In this manner, even during the power reduction mode, a considerable amount of leakage current flows to maintain power to each AOB, thereby consuming a significant amount of power.

SUMMARY OF THE INVENTION

A semiconductor device according to one embodiment includes supply rails, at least one data storage element and at least one corresponding storage latch, and at least one retention latch. The supply rails include a reference supply rail that develops a reference supply voltage, a primary supply rail that develops a primary supply voltage and a retention supply rail that develops a retention supply voltage. The primary supply rail is powered down while the retention supply voltage remains energized during power reduction mode. The data storage elements are powered by the positive supply voltage, and each includes a corresponding storage latch powered by the retention supply voltage. Each storage latch saves a state of a corresponding data storage element in response to the least one retention node being toggled between first and second states. The retention latch includes a retention transistor and retention inverter coupled to a corresponding retention node, in which the retention inverter is powered by the retention supply voltage.

The retention transistor is turned off and then turned back on by the retention inverter when the at least one retention node is toggled between the first and second states during the normal mode, in which the at least one retention latch holds the at least one retention node in the first state during the power reduction mode. Each retention node enables a storage latch to hold the state of a corresponding data storage element during the power reduction mode.

The retention transistor may be an N-type transistor coupled to the reference supply voltage or a P-type transistor coupled to the retention supply rail. In either case, the retention inverter prevents the retention transistor from drawing an appreciable amount of current when the corresponding retention node is toggled, and the retention transistor keeps the retention node at a stable voltage level during the power reduction mode to that corresponding storage latches save their stored states.

The semiconductor device may include a buffer tree including at least one buffer powered by the primary supply voltage that toggles a retention node during the normal mode so that each storage latch stores a state of a corresponding data storage element during the power reduction mode. The buffer tree may include multiple buffers to distributed data storage elements on the semiconductor device, and may be controlled by a power mode circuit. The buffer tree is completely powered down during the power reduction mode to conserve additional power. Multiple retention nodes and corresponding retention latches may be provided to hold a state of a corresponding one of multiple retention nodes during the power reduction mode.

A method of conserving power on a semiconductor device according to one embodiment includes providing a primary supply voltage that is energized during a normal mode and that is de-energized during a power reduction mode, providing a retention supply rail that develops a retention supply voltage that remains energized during both the normal mode and the power reduction mode, providing a data storage element powered by a primary supply voltage, providing a storage latch powered by the retention supply voltage and coupled to the data storage element and to a retention node, providing a retention transistor having a first current terminal coupled to the retention node, having a second current terminal coupled to a selected one of the reference supply rail and the retention supply rail, and having a control terminal, providing a retention inverter powered by the retention supply voltage, having an input coupled to the retention node and having an output coupled to the control terminal of the retention transistor, and saving a state of the data storage element by the storage latch during the normal mode by toggling the retention node from a first state to a second state and back to the first state before entering the power reduction mode.

The method may include turning off and back on the retention transistor by the retention inverter in response to the toggling of the retention node between the first and second states, and holding, by the retention transistor, the retention node in the first state during the power reduction mode. The retention transistor may be N-type or P-type and coupled to hold a corresponding retention node in the first state during the power reduction mode.

The method may include providing a buffer tree comprising at least one buffer powered by the primary supply voltage that is powered down during the power rejection mode, and toggling, by the buffer tree, the retention node before entering the power reduction mode. The buffer tree may include multiple buffers that are powered down during the power reduction mode, and the buffer tree may be controlled by a power mode circuit.

The method may include providing multiple retention nodes, providing multiple retention resistors each coupled to a corresponding retention node, and providing multiple retention inverters, each coupled to a corresponding retention transistor for holding a state of a corresponding retention node during the power reduction mode.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventors have recognized the need to conserve additional power consumption of circuitry during a power reduction mode. They have therefore developed a retention latch powered by the retention supply voltage that holds a retention node into a predetermined state during the power reduction mode. The retention latch holds the retention node stable to ensure that a storage latch holds the state of a corresponding data storage element during the power reduction mode. The retention latch includes a relatively weak holding device coupled to the retention node and an inverter controlled by the retention node to further control the holding device. The holding device may be a pull-down or pull-up device depending upon the normal state of the retention node. The holding device is easily overpowered and turned off by the inverter when the retention node is pulled to an opposite state prompt the storage latch to store the state of its corresponding data storage element. The retention node is pulled back to its normal state causing the inverter to turn the holding device back on to hold the retention node in its normal state during the power reduction mode.

The conventional AOB tree that was used to deliver the retention signal from a power mode controller to each of the data storage elements of the circuitry may be replaced by a standard buffer tree powered by the primary supply voltage rather than the retention supply voltage. In this manner, when the primary supply voltage is de-energized during the power reduction mode, each buffer in the buffer tree delivering the retention signal is also powered down thereby saving a considerable amount of power during the power reduction mode as compared to the conventional configuration.

Figure 1:
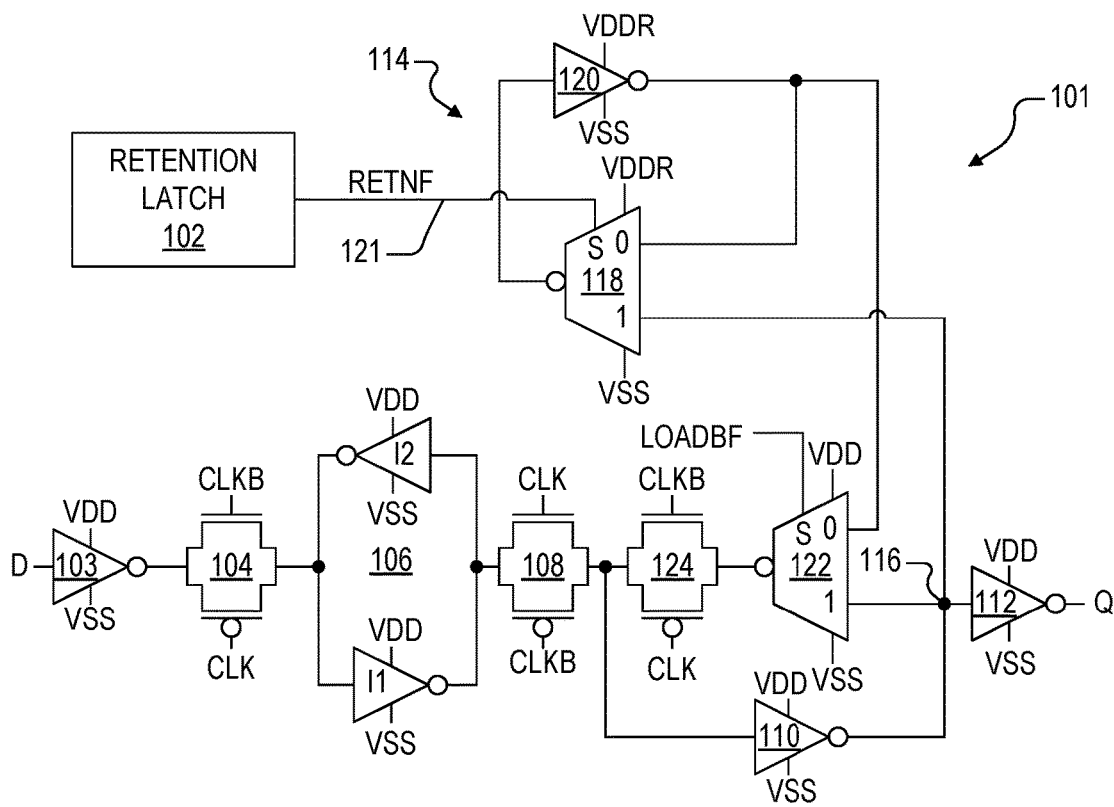
FIG. 1 is a schematic diagram of a data storage element and a storage latch coupled to a retention latch implemented according to one embodiment.

FIG. 1 is a schematic diagram of a data storage element 101 and a storage latch 114 coupled to a retention latch 102 implemented according to one embodiment. The data storage element 101 is configured as a D-type flip-flop (DFF), where it is understood that the data storage element 101 may alternatively be configured as any other type of data storage unit, such as another type of flip-flop (such as for example, a set-reset (SR) flip-flop, a JK flip-flop, a T flip-flop, etc.), or any type of data latch or the like. An input data signal D is provided to the input of an inverter 103, having its output provided to an input of a pass gate 104 (or transmission gate or the like) controlled by a pair of complementary clock signals CLK and CLKB. CLKB is an inverted version of CLK, where in general a "B" appended to the end of a signal name denotes an inverted signal unless otherwise specified. The output of the pass gate 104 is provided to an input of a keeper circuit 106, having its output provided to an input of another pass gate 108. The pass gate 108 separates the "master stage" of the data storage element 101 at the input from the "slave stage" at the output of the data storage element 101. The output of the pass gate 108 is provided to the input of another inverter 110, having its output coupled to a node 116 which is further coupled to the input of yet another inverter 112. The output of the inverter 112 asserts an output signal Q.

The storage latch 114 is provided for storing a state of the data storage element 101 during a power reduction mode, such as a low power mode or sleep mode or the like. The illustrated storage latch 114 is configured as a bubble latch including a 2-input multiplexer (MUX) 118 and an inverter 120, although other types of latch configurations are contemplated. Node 116 of the data storage element 101 is coupled to a logic "1" input of the MUX 118, having an inverting output coupled to the input of the inverter 120, and having a select input coupled to a retention node 121 for receiving a retention signal RETNF. The inverter 120 has an output coupled to the logic "0" input of the MUX 118 and to a logic "0" input of another 2-input MUX 122. The MUX 122 has its logic "1" input coupled to node 116, has its inverting output coupled to an input of another pass gate 124, and has its select input receiving a load signal LOADBF. The output of the pass gate 124 is coupled to the input of the inverter 110.

The pass gates 104, 108, and 124 may each be configured as a cross-coupled pair of N-type and P-type transistors (e.g., NMOS and PMOS, respectively), although other types of configurations are known and contemplated. The pass gates 104, 108, and 124 are each configured to turn on (to operate in a pass mode) for one state of CLK/CLKB in which it passes a signal at its input to its output, and to turn off (to operate in an isolation mode) for an opposite state of CLK/CLKB in which it isolates its input from its output. The particular coupling of CLK/CLKB to the pair of control terminals determines its operating mode. As shown, the pass gates 104 and 124 are each turned on for a first state of CLK/CLKB when CLK is high, and turned off for a second state of CLK/CLKB when CLK is low. The pass gate 108 is coupled in opposite manner, so that it is turned on for the first state of CLK/CLKB and turned off for the second state of CLK/CLKB.

The keeper circuit 106 may be configured as a pair of back-to-back coupled inverters I1 and I2. As shown, the input of I1 is coupled to the output of the pass gate 104 and to the output of the inverter I2, and the input of I2 is coupled to the output of I1 at the output of the keeper circuit 106. The keeper circuit 106 generally operates to latch a binary signal provided at its input to provide an inverted version of the binary signal at its output.

The inverters 103, I1, I2, 110, and 112 and the MUX 122 are each powered by a primary positive supply voltage VDD relative to a reference supply voltage VSS. VSS is charged to any suitable negative, zero or positive voltage level, and is usually coupled to ground (GND) have a voltage of 0 Volts (V). VDD is energized during the normal operating mode, but is de-energized during the power reduction mode. VDD may be de-energized by pulling it low to VSS, or alternatively VDD may be tri-stated or placed into a high-impedance (high-Z) state. When de-energized, most elements or components powered by VDD are powered down drawing minimal or zero current and consuming negligible power.

The inverter 120 and the MUX 118 of the storage latch 114, however, are each powered by a positive supply voltage VDDR relative to VSS, in which VDDR is a retention supply voltage that remains energized during both the normal state and the power reduction mode. In this manner, the state of the data storage element 101, after being latched into the storage latch 114, is retained during the power reduction mode. The "state" is generally represented as a binary data bit or the like.

During normal operation while VDD is energized, the data storage element 101 operates as a master-slave D-type flip-flop during successive clock cycles to latch and transfer the state of D to the state of Q. Also, LOADBF is kept high during the normal mode so that the MUX 122 acts as an inverter to drive its output as an inverted version of the state on node 116. In this manner, the storage latch 114 is effectively removed from the circuit during the normal mode. As described further herein, RETNF is toggled high then low before entering the power reduction mode, so that the state of node 116 is latched into the storage latch 114. The storage latch 114 remains powered during the power reduction mode to hold the stored state. After power is restored, LOADBF is toggled low then back high to transfer the stored state of the storage latch 114 back into the slave stage of the data storage element 101, and normal operations may be resumed.

During the normal mode, a binary signal on D is inverted by the inverter 103 and provided to the pass gate 104. When CLK is high, the pass gate 104 is turned on so that the output of the inverter 103 is passed to the keeper circuit 106, and the pass gate 108 is turned off to isolate the slave portion from the master portion. It is noted that the inverter I2 is made relatively weak compared to the inverter 103, so that when there is any contention between the inverters 103 and I2 (e.g., at opposite logic states), the inverter 103 dominates and switches the keeper circuit 106 to the new state. For example, if the output of the inverter 103 is high while the output of the inverter I2 is low when the pass gate 104 is turned on, the inverter 103 overrides and pulls the input of the inverter I1 towards VDD, which switches the output of I2 high. It is noted that the duration of any such contention is very short, such as on the order of a fraction of a nanosecond (ns), thus consuming negligible power. Once switched, the keeper circuit 106 keeps the new state of D at its output during the current clock cycle.

In the next clock transition when CLK is high, the pass gate 104 is turned off so that the input signal D may change to a next state, and the pass gate 108 is turned on to transfer the current state of the keeper circuit 106 to the slave stage. The MUX 122 and the inverter 110 serve as another keeper circuit while LOADBF is asserted high, in which the inverter I1 is made relatively strong compared to the output of the MUX 122. Thus, when there is any contention between the states of the inverter I1 and the MUX 122 during the normal mode, I1 dominates to switch the state of the inverter 110 which further switches the state of the MUX 122. Again, the duration of any such contention is very short and consumes negligible power. Once the inverter 110 and the MUX 122 are switched, then the slave portion of the data storage element 101 holds the current state. Operation repeats in this manner during subsequent clock cycles.

Figure 2:
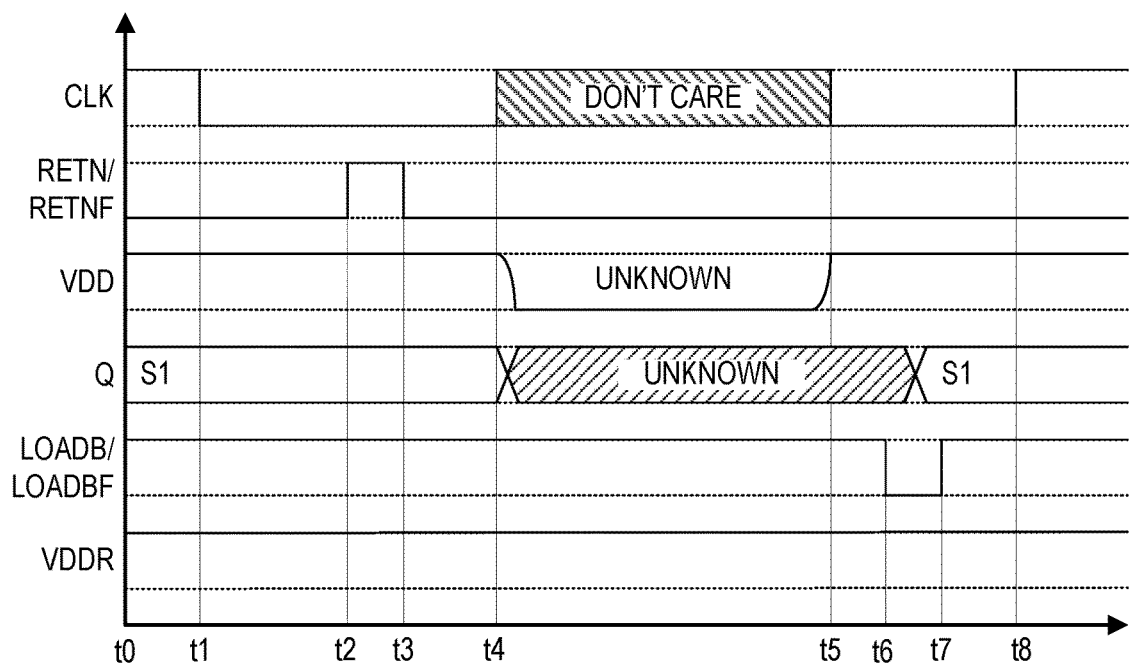
FIG. 2 is a timing diagram illustrating operation of the data storage element and the storage latch of FIG. 1 while transitioning into and out of the power reduction mode.

FIG. 2 is a timing diagram illustrating operation of the data storage element 101 and the storage latch 114 while transitioning into and out of the power reduction mode. The timing diagram plots CLK, RETN/RETNF (in which RETNF is a "final" version of RETN for the particular buffer tree branch), VDD, Q, LOADB/LOADBF (in which LOADBF is a "final" version of LOADB for the particular buffer tree branch), and VDDR versus time. At an initial time t0, VDD and VDDR are both energized high, CLK is high, RETN/RETNF is low, Q is shown having a state S1, and LOADB/LOADBF is high. At subsequent time t1, CLK goes low and the remaining signals remain unchanged.

In anticipation of entering the power reduction mode (PRM), RETNF (which is a delayed and buffered version of RETN) is toggled from its normal state (e.g., low) to the opposite state (e.g., high) and then back to its normal state. As shown, RETNF is pulled high at a subsequent time t2 and then pulled back low at time t3. While RETNF is high, the MUX 118 of the storage latch 114 switches to select its "1" input so that the state of the node 116 in the slave stage of the data storage element 101 is passed to the input of the inverter 120. When RETNF next goes back low at time t3, the state of the node 116, which is an inverted version of state S1 of the data storage element 101, is latched into the storage latch 114. It is noted that VDD remains energized while RETNF is toggled in this manner.

At subsequent time t4, VDD is de-energized in order to enter the power reduction mode (e.g., pulled low to VSS, or tri-stated, or placed into high-Z state), shown having an "unknown" state. During the power reduction mode, the inverters 103, I1, I2, 110, and 112 and the MUX 122 of the data storage element 101, which are each powered by VDD, are powered down to conserve power. The state of the data storage element 101 as indicated by its Q output enters an unknown state. The storage latch 114, however, remains powered and RETNF is held low by the retention latch 102 to retain the state of the data storage element 101 during the power reduction mode. It is noted that clock circuitry may also be powered down so that CLK may be indeterminate or "don't care."

When it is determined to wake up from the power reduction mode to resume normal operations, VDD is first energized back to its normal operating voltage level as shown at subsequent time t5. Thus, the inverters 103, I1, I2, 110, and 112 and the MUX 122 of the data storage element 101 are re-energized to resume normal operation. The clock circuitry powers back up and CLK is initially held low at time t5. After the circuitry is re-energized by VDD, LOADBF is pulled low at time t6 and back high at time t7 while CLK is still low. In response, the MUX 122 selects its "0" input to receive the stored value of the storage latch 114, and the stored value is propagated (and inverted) through the MUX 122 and the inverters 110 and 112 to assert Q back to the state S1. It is noted that the D input may also be restored and passed through the pass gate 104 to set the keeper circuit 106. CLK next goes high after time t8 to resume normal operation.

Figure 3:
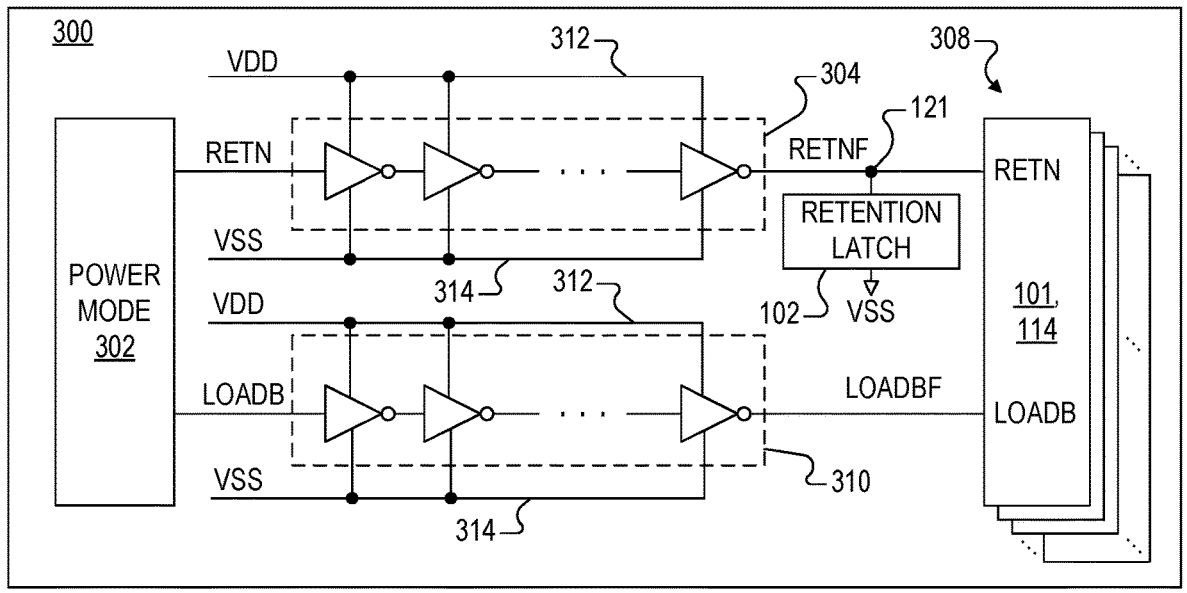
FIG. 3 is a simplified schematic and block diagram of a semiconductor device or integrated circuit (IC) including a state retention circuit implemented according to one embodiment.

FIG. 3 is a simplified schematic and block diagram of a semiconductor device or integrated circuit (IC) 300 including a state retention circuit implemented according to one embodiment. A power mode circuit 302 determines the operating mode of the IC 300, including the normal or full power operation mode and the power reduction mode. The power mode circuit 302 provides the retention signal RETN to an input of a buffer tree 304, which has an output providing the RETNF signal on the retention node 121, so that RETNF is a delayed and buffered version of RETN. The retention node 121 is coupled to a retention input RETN of each of a group 308 of data storage elements and storage latches, including the data storage element 101 and the storage latch 114. The other elements of the group 308 may be configured in a similar manner as the data storage element 101 including a storage latch similar to the storage latch 114. The power mode circuit 302 also provides the LOADB signal to an input of another buffer tree 310, which has an output providing the LOADBF signal as a delayed and buffered version of LOADB. LOADBF is provided to the LOADB input of each of the data storage elements of the group 308 including the data storage element 101.

Figure 6:
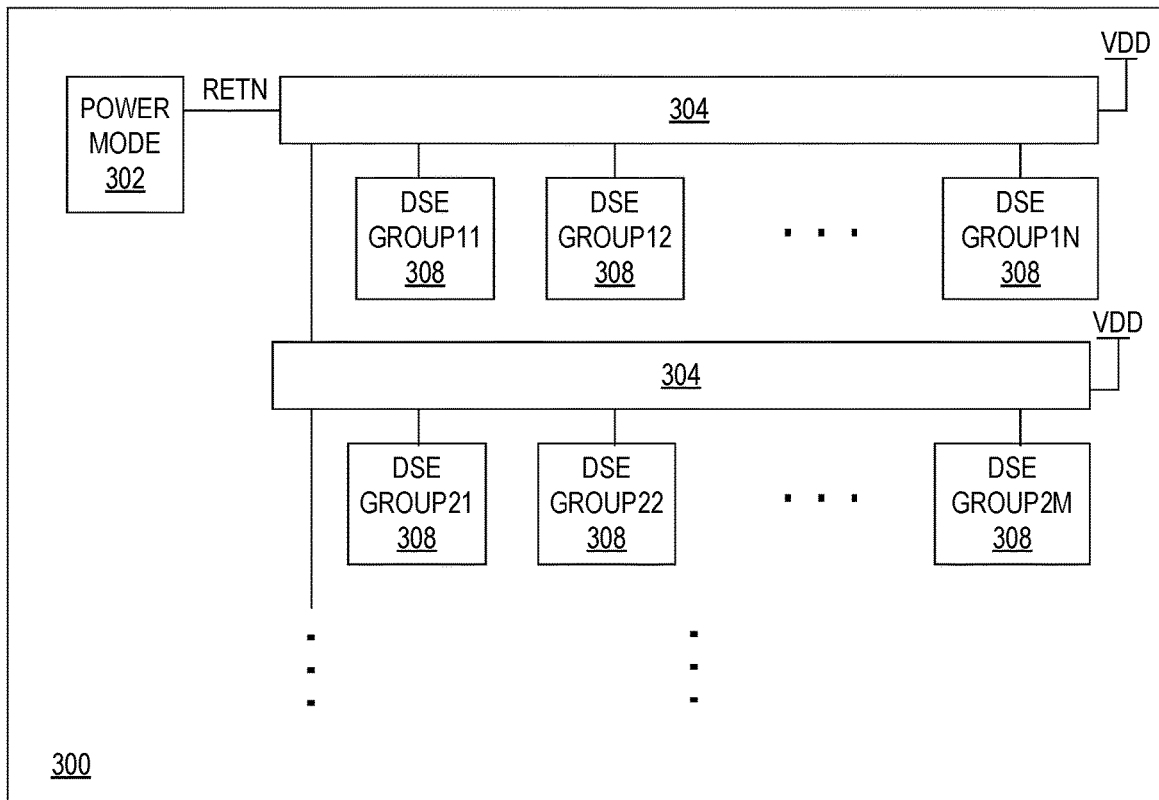
FIG. 6 is a simplified block diagram of the IC of FIG. 3 including the buffer tree routed to multiple groups of data storage elements and storage latches distributed across the IC.

The buffer trees 304 and 310 are both illustrated in simplified form as a set of series-coupled inverters, in which each inverter serves as a buffer to distribute one of the retention or load signals RETN and LOADB to data storage elements distributed across the IC 300. As shown in FIG. 6, for example, the buffer tree 304 is routed to multiple groups 308 of data storage elements (DSEs) distributed across the IC 300, shown as DSE group 11, DSE group 12, . . . , DSE group 1N, DSE group 21, DSE group 22, . . . , DSE group 2M, etc., in which N and M are integers greater than zero. Each group 308 includes any number, such as 1, 4, 8, 16, 32, etc., of data storage elements and corresponding storage latches. In one embodiment, for example, the IC 300 may include thousands, tens of thousands or even hundreds of thousands or more data storage elements depending upon the particular application implemented on the IC 300. Also, each buffer in each of the buffer trees 304 and 310 may include any number of non-inverting buffers rather than just inverting buffers shown. Although not specifically shown, the buffer tree 310 may be distributed in similar manner.

As shown in FIG. 3, each of the buffers of each of the buffer trees 304 and 310 have supply terminals coupled between a VDD supply rail 312 developing VDD and a VSS supply rail 314 developing VSS, so that each buffer is powered by VDD. In this manner, when the IC 300 is placed into the power reduction mode by the power mode circuit 302 in which VDD is de-energized or powered down, the buffers of each of the buffer trees 304 and 310 are also powered down to minimize power consumption. Prior to entering the power reduction mode, the power mode circuit 302 toggles the RETN signal high then low in which RETN is delivered to the storage latches for each of the data storage elements distributed on the IC 300. As previously described, RETNF is toggled high then low in response to RETN causing a storage latch within each of data storage element in the group 308 to store its state. Then the power mode circuit 302 instructs a power circuit (not shown) to de-energize VDD. The power mode circuit 302 may remain at least partially powered, so that when it is determined to wake up, it instructs the power circuit to re-energize VDD. Once powered up, the power mode circuit 302 toggles LOADB low then back high. As previously described, toggling LOADBF low and then high transfers the stored state of the storage latch within each of data storage element in the group 308 to reload each of the data storage elements.

Figure 4:
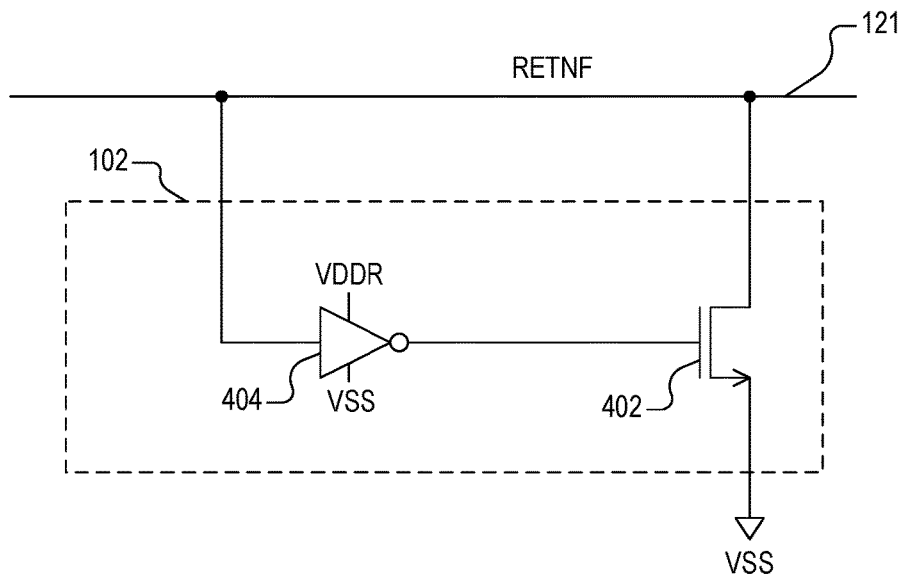
FIG. 4 is a schematic diagram of the retention latch of FIG. 1 implemented according to one embodiment coupled to the retention node.

FIG. 4 is a schematic diagram of the retention latch 102 implemented according to one embodiment coupled to the retention node 121. A state retention latch (similar to the retention latch 102) is provided for and coupled to each retention node (similar to the retention node 121) for each group of data storage elements (similar to the group 308). The retention latch 102 includes an N-type transistor 402 and an inverter 404. The inverter 404 is powered between the retention positive supply voltage VDDR and VSS and has its input coupled to the retention node 121 developing RETNF. The N-type transistor includes current terminals coupled between the retention node 121 and VSS and a control terminal coupled to the output of the inverter 404. In one embodiment, the transistor 402 may be configured as an N-type transistor (NMOS or NFET or the like) having its source terminal coupled to the retention node 121, its drain terminal coupled to the VSS, and its gate terminal coupled to the output of the inverter 404. In one embodiment, the transistor 402 may be configured as a weak or "long-channel" pull down device pulling RETNF low to VSS when turned on.

During normal operation, RETN and thus RETNF are both pulled low to VSS. The output of the inverter 404 is pulled high turning on the transistor 402 to "keep" RETNF pulled low. When RETN/RETNF is pulled high before entering the power reduction mode, the transistor 402, being a relatively weak device, is over-driven by the last buffer of the buffer tree 304. As RETNF begins to go high, the inverter 404 begins to switch its output low which begins to turn off the transistor 402. The inverter 404 then quickly switches to turn the transistor 402 fully off. In this manner, the transistor 402 is switched off very quickly consuming a negligible amount of power, and each of the storage latches (e.g., storage latch 114) of the data storage elements of the group 308 store the state of their respective data storage element (e.g., data storage element 101). When RETN/RETNF is pulled back low, the inverter 404 switches its output high to turn the transistor 402 back on. In this manner, the retention node 121 is held low during the power reduction mode without having to keep the buffers of the buffer tree 304 powered on, and the states of the data storage elements of the IC 300 are saved.

Figure 5:
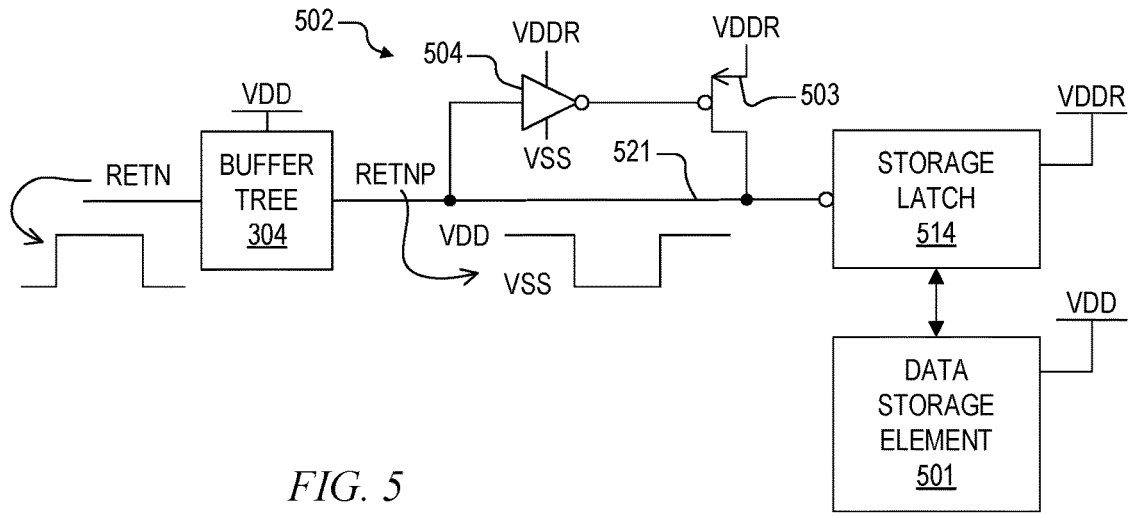
FIG. 5 is a schematic diagram of a state retention latch implemented according to an alternative embodiment for keeping a retention node high during the power reduction mode.

FIG. 5 is a schematic diagram of a state retention latch 502 implemented according to an alternative embodiment for keeping a retention node 521 high during the power reduction mode. A data storage element 501 may be configured in a similar manner as the data storage element 101, such as a flip-flop or a latch or the like, and is powered by VDD which is energized during the normal mode and de-energized during the power reduction mode as previously described. A storage latch 514, powered by the retention supply voltage VDDR, is coupled to the data storage element 501 for storing its state during the power reduction mode. The storage latch 514 may be configured in substantially similar manner as the storage latch 114, except that it has an inverted retention input coupled to a retention node 521 that develops a retention signal RETNP. RETNP is a delayed and buffered version of RETN provided by the buffer tree 304 in a similar manner as RETNF, except that RETNP is normally pulled high to VDD rather than normally pulled low to VSS. As shown in FIG. 3, the buffer tree 304 may have multiple inverting buffers so that any number of nodes therein are toggled to opposite states of RETN. In this manner as shown, when RETN is toggled high and then back low, RETNP is toggled low and then back high causing the storage latch 514 to store the state of the data storage element 501.

In this case, a P-type transistor 503 has its drain terminal coupled to the retention node 521 and its source terminal coupled to VDDR. An inverter 504 powered by VDDR has its input coupled to the retention node 521 and its output coupled to the gate terminal of the transistor 503. During normal operation while RETNP is high, the inverter 504 pulls the gate terminal of the transistor 503 low turning it on to keep RETNP pulled high. When RETNP is toggled low to cause the storage latch 514 to latch the current state of the data storage element 501, the buffer tree 304 briefly overpowers the transistor 503 and the inverter 504 toggles its output high to quickly turn the transistor fully off. In a similar manner as described above for the transistor 402, the transistor 503 is switched off very quickly consuming a negligible amount of power. When the buffer tree 304 pulls RETNP back high, the inverter 504 turns on the transistor 503. When VDD is de-energized powering down the buffer tree 304, the inverter 504 remains powered to drive the transistor 503 to keep the retention node 521 pulled high. In this manner, the storage latch 514 retains the stored state of the data storage element 501 during the power reduction mode.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A method of conserving power on a semiconductor device, comprising:
   providing a reference supply rail that develops a reference supply voltage;
   providing a primary supply rail that develops a primary supply voltage relative to the reference supply voltage during a normal mode;
   de-energizing the primary supply voltage during a power reduction mode;
   providing a retention supply rail that develops a retention supply voltage relative to the reference supply voltage during both the normal mode and the power reduction mode;
   providing a data storage element powered by the primary supply voltage, and providing a storage latch powered by the retention supply voltage which is coupled to the data storage element and to a retention node;
   providing a retention transistor having a first current terminal coupled to the retention node, having a second current terminal coupled to a selected one of the reference supply rail and the retention supply rail, and having a control terminal;
   providing a retention inverter powered by the retention supply voltage, having an input coupled to the retention node and having an output coupled to the control terminal of the retention transistor; and
   saving a state of the data storage element by the storage latch during the normal mode by toggling the retention node from a first state to a second state and back to the first state before entering the power reduction mode.

2. The method of claim 1, further comprising:
   turning off and back on the retention transistor by the retention inverter in response to the toggling of the retention node between the first and second states; and
   holding, by the retention transistor, the retention node in the first state during the power reduction mode.

3. The method of claim 1, further comprising:
   turning on the retention transistor by the retention inverter during the normal mode to pull the at least one retention node towards the reference supply voltage;
   turning off the retention transistor by the retention inverter when the retention node is pulled high; and
   turning the retention transistor back on by the retention inverter when the at least one retention node is pulled back low to pull the retention node towards the reference supply voltage during the power reduction mode.

4. The method of claim 3, wherein the providing a retention transistor comprises providing an N-type transistor having a drain terminal coupled to the retention node, having a source terminal coupled to the reference supply rail, and having a control terminal coupled to the output of the retention inverter.

5. The method of claim 1, further comprising:
   turning on the retention transistor by the retention inverter during the normal mode to pull the at least one retention node towards the reference supply voltage;
   turning off the retention transistor by the retention inverter when the retention node is pulled low; and
   turning the retention transistor back on by the retention inverter when the at least one retention node is pulled back high to pull the retention node towards the retention supply voltage during the power reduction mode.

6. The method of claim 5, wherein the providing a retention transistor comprises providing a P-type transistor having a drain terminal coupled to the retention node, having a source terminal coupled to the retention supply rail, and having a control terminal coupled to the output of the retention inverter.

7. The method of claim 1, further comprising:
   providing a buffer tree comprising at least one buffer powered by the primary supply voltage that is powered down during the power rejection mode; and
   wherein the toggling the retention node comprises the buffer tree toggling the retention node before entering the power reduction mode.

8. The method of claim 7, wherein the providing a buffer tree comprises providing a plurality of buffers that are powered by the primary supply voltage that are powered down during the power reduction mode.

9. The method of claim 7, further comprising providing a power mode circuit that controls the buffer tree.

10. The method of claim 1, comprising:
providing a plurality of retention nodes;
the providing a retention transistor comprising providing a plurality of retention resistors each coupled to a corresponding one of the plurality of retention nodes; and
the providing a retention inverter comprising providing a plurality of retention inverters, each coupled to a corresponding one of the plurality of retention transistors for holding a state of a corresponding one of the plurality of retention nodes during the power reduction mode.

* * * * *